United States Patent [19]

Berner

[11] 4,279,720
[45] Jul. 21, 1981

[54] PHOTOCURABLE COMPOSITION

[75] Inventor: Godwin Berner, Basel, Switzerland

[73] Assignee: Ciba-Geigy Corporation, Ardsley, N.Y.

[21] Appl. No.: 54,129

[22] Filed: Jul. 2, 1979

[30] Foreign Application Priority Data

Jul. 13, 1978 [CH] Switzerland ................. 7621/78

[51] Int. Cl.³ .................. C08F 4/00; C08F 2/50
[52] U.S. Cl. ................ 204/159.23; 204/159.15; 204/159.16; 204/159.18; 204/159.19; 204/159.24; 260/45.9 R
[58] Field of Search ............. 204/159.23, 159.15; 260/45.9 R

[56] References Cited

U.S. PATENT DOCUMENTS

| | | | |
|---|---|---|---|
| 3,639,321 | 2/1972 | Fuhr et al. | 260/28.5 |
| 3,640,928 | 2/1972 | Murayama et al. | 260/23 XA |
| 3,684,765 | 8/1972 | Matsui et al. | 260/45.8 N |
| 3,993,655 | 11/1976 | Rasberger et al. | 260/45.8 N |
| 4,024,296 | 5/1977 | Gruber | 204/159.23 |
| 4,024,297 | 5/1977 | Gruber | 204/159.23 |
| 4,038,164 | 7/1977 | Via | 204/159.23 |
| 4,046,737 | 9/1977 | Holt et al. | 260/45.8 N |
| 4,056,507 | 11/1977 | Ramey et al. | 260/45.75 N |
| 4,201,642 | 5/1980 | Nowak | 204/159.15 |

FOREIGN PATENT DOCUMENTS

49-104989  4/1974  Japan .................. 204/159.15

OTHER PUBLICATIONS

Chem. Abstracts 83-60490h (1975).
Chem. Abstracts 88-74945a (1978).
Chem. Abstracts 87-118757b (1977).
Chem. Abstracts 87-54073r (1977).

*Primary Examiner*—Wilbert J. Briggs, Sr.
*Attorney, Agent, or Firm*—Luther A. R. Hall

[57] ABSTRACT

The use of photo-initiators of the formula I

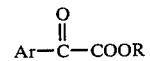

in which Ar is a $C_6$–$C_{14}$-aryl radical which is unsubstituted or mono-, di- or tri-substituted by $C_1$–$C_4$-alkyl, $C_1$–$C_4$-alkoxy, phenoxy, $C_1$–$C_4$-alkylthio, phenylthio or halogen, and R is $C_1$–$C_{12}$-alkyl, $C_5$–$C_6$-cycloalkyl, $C_6$–$C_{10}$-aryl or alkaryl, $C_7$–$C_{11}$-aralkyl or $C_3$–$C_6$-alkoxyalkyl, in combination with light stabilizers from the category of the polyalkylpiperidine derivatives in the photopolymerization of ethylenically unsaturated compounds results in polymers with high stability to light and a low degree of yellowing.

8 Claims, No Drawings

PHOTOCURABLE COMPOSITION

The invention relates to photocurable compositions of one or more photocurable, ethylenically unsaturated compounds, a photo-initiator and a light stabiliser, which compositions can also contain other conventional additives if desired.

It is known that the photopolymerisation of ethylenically unsaturated compounds can be considerably accelerated by the addition of photo-initiators. This is of decisive importance for the technical application of photopolymerisation reactions, for example for lacquers, coatings, moulding compositions or print pastes. Various categories of organic compounds have been disclosed as photo-curing agents, for example derivatives of benzophenone, of benzoin, of acetophenone or of benzil. Esters of phenylglyoxylic acid have also already been proposed as photo-initiators in U.S. Pat. No. 4,038,164.

For specific applications of photopolymerisation, there is a need to protect the cured compositions against yellowing or degradation by the action of light. This applies in particular in the case of use for unpigmented coatings and moulding compositions, for example in the case of clear lacquers, coatings on plastics or coatings on printed paper and cardboard articles.

The obvious solution to the problem would be the addition of light stabilisers, such as are customary for stabilising plastics and lacquers. Such solutions have already been proposed, for example the combination of benzoin ethers as photo-initiators with UV absorbers as light stabilisers is proposed in German Offenlegungsschrift No. 1,694,253. These UV absorbers have the disadvantage that they retard the photopolymerisation, due to their absorption in the UV. The acceleration of the photopolymerisation achieved by the addition of a photoinitiator is thus partially eliminated again by the UV absorber used, in particular if the UV absorber is used in an amount of more than 0.3%.

An advance can be achieved if light stabilisers from the category of the polyalkylpiperidine derivatives are used in place of the UV absorbers. These derivatives do not retard the rate of curing, even if they are used in amounts of 1–2%. However, the piperidine derivatives have the disadvantage that with most photoinitiators they produce yellowing of the polymerised composition after UV curing.

Surprisingly, it has now been found that such yellowing due to piperidine light stabilisers takes place to a substantially lesser extent if very specific compounds are used as the photo-initiators. The invention therefore relates to photocurable compositions consisting of (a) one or more ethylenically unsaturated, photocurable compounds, (b) at least one photo-initiator of the formula I

$$Ar-\overset{O}{\underset{\|}{C}}-COOR \qquad (I)$$

in which Ar is a $C_6$–$C_{14}$-aryl radical which is unsubstituted or mono-, di- or tri-substituted by $C_1$–$C_4$-alkyl, $C_1$–$C_4$-alkoxy, phenoxy, $C_1$–$C_4$-alkylthio, phenylthio or halogen and R is $C_1$–$C_{12}$-alkyl, $C_5$–$C_6$-cycloalkyl, $C_6$–$C_{10}$-aryl or alkaryl, $C_7$–$C_{11}$-aralkyl or $C_3$–$C_6$-alkoxyalkyl, (c) at least one light stabiliser from the category of the polyalkylpiperidine derivatives and (d) if desired one or more other additives customary in plastics technology.

Ethylenically unsaturated compounds which can be used according to the invention are the photocurable monomers, oligomers or polymers known to those skilled in the art. Such monomers containing one or more photopolymerisable double bonds are, for example, the esters of acrylic acid or methacrylic acid, for example methyl acrylate, ethyl acrylate, n- or tert.-butyl acrylate, isooctyl acrylate, 2-ethylhexyl acrylate, phenyl acrylate, benzyl acrylate, 2-hydroxyethyl acrylate or 2-hydroxypropylacrylate, methyl methacrylate or ethyl methacrylate, ethylene diacrylate, neopentyl diacrylate, trimethylolpropane trisacrylate, pentaerythritol tetraacrylate or pentaerythritol trisacrylate; acrylonitrile, methacrylonitrile, acrylamide, methacrylamide and N-substituted (meth)-acrylamides; vinyl esters, for example vinyl acetate, vinyl propionate, vinyl acrylate or vinyl succinate; other vinyl compounds such as vinyl ethers, styrene, alkylstyrenes, halogenostyrenes, divinyl benzene, vinylnaphthalene, N-vinylpyrrolidone, vinyl chloride or vinylidene chloride; allyl compounds, such as diallyl phthalate, diallyl maleate, triallyl isocyanurate, triallyl phosphate or ethylene glycol diallyl ether and the mixtures of such unsaturated monomers.

Photopolymerisable unsaturated oligomers or polymers are, for example, thermoplastic resins, which contain unsaturated groups such as fumarate, allyl groups or acrylate or methacrylate groups, unsaturated polyesters, unsaturated acrylic resins and isocyanate-modified or epoxide-modified acrylate oligomers and also polyester and polyether acrylate oligomers. Photopolymerisable polymers are preferably used in a mixture with photopolymerisable monomers. The compounds used as component (a) are preferably acrylic and methacrylic acid derivatives and mixtures thereof, and polyurethane acrylates and mixtures thereof with other acrylic or methacrylic acid derivatives are particularly preferred. Such polyurethane acrylates are prepared from polyols or polyetherdiols by reaction with excess diisocyanate and subsequent reaction of the product with hydroxyalkyl acrylates.

The photo-initiators of the formula I which are used according to the invention as component (b) are known compounds and have been described as photo-initiators in U.S. Pat. No. 4,038,164. They are esters of arylglyoxylic acids.

Examples of the radical Ar in formula I are phenyl, naphthyl, phenanthryl, diphenylyl, tolyl, xylyl, tert.-butylphenyl, isopropylphenyl, methoxy-, ethoxy- or isopropoxy-phenyl, butoxynaphthyl, phenoxyphenyl, methylthiophenyl, tert.-butylthiophenyl, phenylthionaphthyl, chlorophenyl, bromonaphthayl, dibromophenyl, chlorotolyl, methoxyxylyl or dichlorotolyl. Ar is preferably phenyl or alkylphenyl and particularly preferentially phenyl.

Alkyl R can be, for example, methyl, ethyl, isopropyl, butyl, tert.-butyl, isopentyl, hexyl, octyl, 2-ethylhexyl, decyl or dodecyl. Aryl or alkaryl R can be, for example, phenyl, naphthyl, tolyl or butylphenyl. Aralkyl R can be, for example, benzyl, phenylethyl, phenylpropyl or naphthylmethyl. Alkoxyalkyl R can be, for example, methoxyethyl, ethoxyethyl, isopropoxyethyl or methoxypropyl. R is preferably $C_1$–$C_4$-alkyl, especially methyl or ethyl.

Examples of photo-initiators of the formula I which can be used are: methyl phenylglyoxylate, ethyl phenylglyoxylate, benzyl phenylglyoxylate, 2-ethylhexyl phenylglyoxylate, phenyl phenylglyoxylate, 2-ethoxyethyl phenylglyoxylate, ethyl p-chlorophenylglyoxylate, ethyl p-phenoxyphenylglyoxylate, methyl m-methoxyphenylglyoxylate, methyl p-isopropylphenylglyoxylate, methyl p-methylthiophenylglyoxylate, butyl o-tolylglyoxylate, hexyl 2-naphthylglyoxylate, ethyl 1-bromo-2-naphthylglyoxylate and ethyl 2,4-dibromophenylglyoxylate.

In certain cases it can be advantageous to use a mixture of 2 or more compounds of the formula I as the photo-initiator, for example in order to improve the solubility.

The amount of photo-initiators in the photocurable composition is 0.1 to 10% by weight. If photocuring is carried out with the exclusion of oxygen, for example under nitrogen, about 0.1–1% by weight suffices; if the reaction is carried in air, about 2–5% by weight are required.

The polyalkylpiperidine derivatives used according to the invention as the light stabilisers comprising component (c) are monomeric, oligomeric or polymeric compounds which contain a radical of the formula

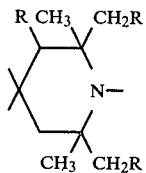

in which R is hydrogen or methyl, but preferably hydrogen. Such compounds are known light stabilisers, especially the 4-acyloxypiperidine derivatives of the type described, for example, in German Offenlegungsschriften 1,929,928 and No. 2,258,752 and the 4-aminopiperidine derivatives of the type described, for example, in German Offenlegungsschriften No. 2,040,975 and 2,349,962. These piperidine light stabilisers can also contain unsaturated groups which are photopolymerisable, for example 4-acryloxypiperidine, 4-acrylamidopiperidines or 1-(meth)acrylolylpiperidines. In this case, copolymerisation of the light stabiliser with compound (a) can take place during photocuring. A light stabiliser copolymerised in this way has the advantage that it is not removable by extraction or migration, so that its effect is very long-lasting. A similar effect is also achieved by the use of oligomeric or polymeric piperidine light stabilisers, such as are described, for example, in German Offenlegungsschrift 2,719,131 or in European Patent Application Publication No. 496. Furthermore, the piperidine light stabilisers can also contain sterically hindered phenol groups, as a result of which they act at the same time as an antioxidant. Such compounds are described, for example, in German Offenlegungsschrift Nos. 2,456,864 or 2,647,452.

The piperidine light stabilisers can also be used in the form of their salts with inorganic or organic acids and also in the form of their complexes with nickel compounds, such as are described in German Offenlegungsschrift No. 2,625,967 and in European Patent Application Publication No. 1840.

In certain cases, the addition of the piperidine light stabilisers can also effect acceleration of photocuring and this is an additional advantage.

Examples of light stabilisers of the category of polyalkylpiperidine derivatives which can be used are: 4-benzoyloxy-2,2,6,6-tetramethylpiperidine, 4-stearoyloxy-2,2,6,6-tetramethylpiperidine, 4-acryloxy-2,2,6,6-tetramethylpiperidine, 4-(p-chlorobenzoyloxy)-1,2,2,6,6-pentamethylpiperidine, 4-lauroyloxy-1,2,2,6,6-pentamethylpiperidine, 4-methacryloxy-1,2,2,6,6-pentamethylpiperidine, 1-allyl-2,2,6,6-tetramethyl-4-piperidinyl salicylate, 1-(2-benzoyloxyethyl)-2,2,6,6-tetramethyl-4-piperidinyl benzoate, bis-(1,2,2,6,6-pentamethyl-4-piperidinyl) isophthalate, bis-(1,2,2,6,6-pentamethyl-4-piperidinyl) adipate, bis-(2,2,6,6-tetramethyl-4-piperidinyl) sebacate, bis-(1-acetyl-2,2,6,6-tetramethyl-4-piperidinyl) sebacate, bis-(1-hydroxyethyl-2,2,6,6-tetramethyl-4-piperidinyl) succinate, bis(1-benzyl-2,2,6,6-tetramethyl-4-piperidinyl)sebacate, bis-(1-allyl-2,2,6,6-tetramethyl-4-piperidinyl)adipate,bis-(1,2,2,6,6-pentamethyl-4-piperidinyl)-sebacate, tris-(2,2,6,6-tetramethyl-4-piperidinyl)-nitriloacetate, tris-(1-butyl-2,2,6,6-tetramethyl-4-piperidinyl) trimellitate, tris-(1-butyl-2,2,6,6-tetramethyl-4-piperidinyl) phosphate, diphenyl-bis-(2,2,6,6-tetramethylpiperidin-4-oxy)-silane, di-(1,2,2,6,6-pentamethyl-4-piperidinyl) dibutylmalonate, di-(2,2,6,6-tetramethyl-4-piperidinyl) butyl-(3,5-di-tert.-butyl-4-hydroxybenzyl)-malonate, 0,0'-di-(2,2,6,6-tetramethyl-4-piperidinyl) tolylene-1,4-dicarbamate, 1-methylcarbamoyl-2,3,6-trimethyl-2,6-diethyl-4-piperidinyl methylcarbamate, 4-acetylamino-1,2,2,6,6-pentamethylpiperidine, N,N'-bis-(2,2,6,6-tetramethyl-4-piperidinyl)-hexamethylene-1,6-diamine, N,N'-bis-(2,2,6,6-tetramethyl-4-piperidinyl)-N,N'-dibutyladipamide, 1-benzyl-2,2,6,6-tetramethyl-4-diethanolamino-piperidine, 4-acrylamido-1,2,2,6,6-pentamethylpiperidine, 9-aza-8,8,10,10-tetramethyl-1,5-dioxaspiro[5.5]undecane, 9-aza-3-ethyl-3-acetoxymethyl-9-acetyl-8,8,10,10-tetramethyl-1,5-dioxaspiro[5.5]undecane, 1,3,8-triaza-3,7,7,9,9-pentamethylspiro[4.5]decane-2,4-dione, 3-n-octyl-1,3,8-triaza-7,7,9,9-tetramethylspiro[4.5]decane-2,4-dione, 2,2,4,4-tetramethyl-7-oxa-3,20-diaza-21-oxo-dispiro[5.1.11.2]heneicosane, 1,3-di-(2,2,6,6-tetramethyl-4-piperidinyl)-imidazolidinone-2,2,4,6-tri[N-(2,2,6,6-tetramethyl-4-piperidinyl-butylamino]-s-triazine, 2,4-diphenoxy-6-(2,2,6,6-tetramethyl-4-piperidinoxy)-s-triazine, 2-dibutylamino-4,6-di[N-(1,2,2,6,6-pentamethyl-4-piperidinyl)-ethylamino]-s-triazine, 1,4-bis-(2,2,6,6-tetramethyl-1-piperidino)-but-2-ene, di-[2-(2,2,6,6-tetramethyl-1-piperidine)-ethyl] adipate, n-octyl 2,2,6,6-tetramethylpiperidine-1-acetate, a polyester of adipic acid, sebacic acid, dibutylmalonic acid, oxalic acid or isophthalic acid and 1-hydroxyethyl-2,2,6,6-tetramethyl-4-hydroxypiperidine, a polyamide from succinic acid, adipic acid or phthalic acid and 1-(3-aminopropyl)-2,2,6,6-tetramethyl-4-aminopiperidine, a polyamide from oxalic acid or p-phenylenediacetic acid and N,N'-di-(1,2,2,6,6-pentamethyl-4-piperidinyl)-1,6-diaminohexane, tetrakis-(2,2,6,6-tetramethyl-4-piperidinyl)-1,8,11,18-tetraazaoctadecane, a polyamine from 1,2,2,6,6-pentamethyl-4-aminopiperidine and epichlorohydrin or bisphenol A diglycidyl ether, a polytriazine from 2,4-dichloro-6-N-(1,2,2,6,6-pentamethyl-4-piperidinyl)-ethylamino-s-triazine and N,N'-bis-(2,2,6,6-tetramethyl-4-piperidinyl)-1,6-diaminohexane, a polytriazine from 2,4-dichloro-6-(1,1,3,3-tetramethyl-butylamino)-s-triazine and N,N'-bis-(2,2,6,6-tetramethyl-4-piperidinyl)-1,6-diaminohexane, a polymer from 1,2,2,6-pentamethyl-4-methacryloxypiperidine, a copolymer of 1-benzyl-2,2,6,6-tetramethyl-4-acrylamidopiperidine and N-butylacrylamide, the salt of 1 mol of H$_3$PO$_4$ and 1 mol of di-(1,2,2,6,6-pentamethyl-4-piperidinyl) adipate, the salt of 2 mols of bis-(3,5-di-tert.-butyl-4-hydroxybenzyl)-malonic acid and 1 mol of 2,2,6,6-tetramethyl-4-lauroyloxypiperidine, the 1:1 complex of bis-(2,2,6,6-tetramethyl-4-piperidinyl) sebacate and nickel-II acetylacetonate and the 1:2 complex of bis-(1,2,2,6,6-pentamethyl-4-piperidinyl) adipate and nickel-II acetate.

Further examples of piperidine light stabilisers which can be used according to the invention are described in European Patent Application Publication No. 2753.

In certain cases it can be advantageous to use a mixture of 2 or more light stabilisers from the series comprising the polyalkylpiperidine derivatives. The amount of light stabilisers in the photocurable composition is 0.02 to 5% by weight, preferably 0.5 to 2% by weight, and depends on the desired degree of stabilisation.

As component (d), the compositions can contain further additives of the type customary in plastics technology and especially of the type customary in the technology of photocurable coatings. Examples of such additives are stabilisers to increase the dark storage stability, chain transfer agents, dyes, pigments, paraffins or waxes, stabilisers to increase the stability to heat, antioxidants or flow control agents. Pigments can be present in the compositions in amounts of up to 50%. The other additives, on the other hand, are used only in small amounts.

The components are mixed by the customary methods. Preferably, a liquid compound or mixture is used as component (a). In this case (b), (c) and, if desired, (d) can be mixed into component (a) by stirring. This can result in a homogeneous solution or a dispersion. In both cases, a composition forms which can be applied to solid surfaces by methods customary in coating technology, for example by spreading, dipping, spraying or rolling. The substrates can be any type of solid material, for example metal, wood, plastics, glass, ceramics, paper or textiles. Applications of particular importance are the coating of wood, for example for furniture, floors or wall elements, the coating of decorative sheets, for example printed cardboard, plastic or fibreboard sheets, and the coating of plastics, for example floor coverings or plastic imitation veneers. The compositions according to the invention are also suitable for the production of light-stable moulded compositions, in particular transparent moulded compositions, for example sheets of acrylic glass or unsaturated polyesters.

The polymerisation of the coating applied or of the moulding composition is effected by the known methods of photopolymerisation, by irradiation with light which is rich in short-wave radiation. Suitable light sources are, for example, medium pressure, high pressure and low pressure mercury lamps and also superactinic fluorescent tubes, the emission maxima of which are in the range between 250 and 400 nm.

The necessary exposure time must be determined experimentally for each composition, using the particular layer thickness and type of radiation source. For thin layers, the exposure time - depending on the radiation source-is about 0.1 to 10 seconds. The wipe resistance of the surface can first be assessed, as a measure of the curing. A more precise measure, which also gives a picture of the through-curing, is the measurement of the pendulum hardness according to König (DIN 33,157). The degree of curing of moulded compositions can be assessed by measuring the Barcol hardness or the Shore D hardness.

The yellowing of the coatings and moulded compositions can be measured by spectroscopic measurement of the Yellowness Index (YI) according to ASTM-D 1925/63 T or of the transmission loss at 400 nm.

The examples which follow show the use of compositions according to the invention compared with those of the prior art. In the examples parts and percentages are by weight unless indicated otherwise. The temperature is in degrees centigrade.

EXAMPLE 1

The following experiments show the yellowing of photopolymerised transparent coatings based on a polyurethane acrylate. Compositions having the following base recipe are used:

70 parts of EBECRYL 204 (polyurethane acrylate based on tolylene diisocyanate from UCB, Brussels), 27 parts of 1,6-hexanediol diacrylate and 3 parts of photo-initiator, 0 or 1 or 2 parts of light stabiliser, corresponding to Table 1, are added to this mixture.

The photo-initiators used were:

A = methyl phenylglyoxylate (according to the invention)

B = benzil dimethyl ketal (as comparison)

C = α-diethoxy-acetophenone (as comparison)

The light stabiliser used was:

LS I = bis-(2,2,6,6-tetramethyl-4-piperidinyl) sebacate.

The mixtures were applied in a layer thickness of 70–80μ to sheet aluminium painted white and were exposed for 1.5 seconds in a HANOVIA laboratory apparatus. The samples were stored in the dark for 1 week and then exposed for 720 hours in a XENOTEST 150. Table 1 shows the Yellowness Index according to ASTM-D 1925/63 T immediately after photocuring, after 24 hours storage in the dark and after various periods of exposure in the Xenotest. The longer the exposure times, the more clearly can the differences between samples which have not been stabilised and samples light-stabilised according to the invention as discerned, whilst in the case of the comparison samples virtually no difference can be seen.

TABLE 1

| | | Yellowness Index after | | | | |
|---|---|---|---|---|---|---|
| | | | 1 week's storage | Irradiation in the Xenotest 150 | | |
| Photo-initiator | Light stabiliser | UV curing | in the dark | 24 hours | 216 hours | 720 hours |
| A | — | 2.7 | 2.7 | 2.4 | 4.2 | 10.3 |
| | 1% LS I | 3.5 | 3.5 | 3.2 | 3.5 | 6.5 |
| | 2% LS I | 2.9 | 3.1 | 2.7 | 3.2 | 5.7 |
| B (comparison) | — | 5.6 | 3.2 | 11.5 | 12.3 | 18.2 |
| | 1% LS I | 7.8 | 3.5 | 11.4 | 13.3 | 17.6 |
| | 2% LS I | 6.3 | 4.3 | 12.0 | 15.2 | 19.8 |
| C (comparison) | — | 2.3 | 4.2 | 5.3 | 5.8 | 10.2 |
| | 1% LS I | 3.4 | 12.3 | 3.7 | 6.0 | 9.6 |
| | 2% LS I | 6.7 | 15.2 | 5.3 | 7.3 | 12.1 |

EXAMPLE 2

The experiments of Example 1 were repeated except that the samples were exposed in the Xenotest 150 with weathering at the same time. The results in Table 2 are similar to those of Example 1.

TABLE 2

| Photo-initiator | Light stabiliser | Yellowness Index after | | | | |
|---|---|---|---|---|---|---|
| | | UV curing | 1 week's storage in the dark | Irradiation in the Xenotest 150, moist | | |
| | | | | 24 hours | 216 hours | 720 hours |
| A | — | 2.9 | 3.1 | 3.4 | 5.3 | 12.0 |
| | 1% LS I | 3.5 | 3.6 | 3.4 | 3.9 | 7.6 |
| | 2% LS I | 2.9 | 2.8 | 2.4 | 2.8 | 5.2 |
| C (comparison) | — | 2.4 | 4.4 | 5.0 | 8.3 | 13.5 |
| | 1% LS I | 3.8 | 11.8 | 4.7 | 5.7 | 9.2 |
| | 2% LS I | 7.3 | 15.7 | 7.4 | 9.6 | 13.6 |

EXAMPLE 3

The following experiments show the influence of the light stabilisers used on the rate of photopolymerisation, measured by the pendulum hardness of the polymerised film.

The base recipe used is the same as that in Example 1. The photo-initiator used was methyl phenylglyoxylate.

The light stabilisers used were: piperidine derivatives according to the invention:

LS I = bis-(2,2,6,6-tetramethyl-4-piperidinyl) sebacate
LS IV = bis-(1,2,2,6,6-pentamethyl-4-piperidinyl) sebacate
LS V = 1-hydroxyethyl,2,2,6,6-tetramethyl-4-diethanolamino-piperidine
LS VI = 4-hydroxy-2,2,6,6-tetramethylpiperidine
LS VII = 4-amino-2,2,6,6-tetramethylpiperidine
LS VIII = 1-hexyl-2,2,6,6-tetramethyl-4-hydroxypiperidine
LS IX = 1-(2-hydroxybutyl)-2,2,6,6-tetramethyl-4-piperidine UV absorbers as comparison:

UV I = 2-hydroxy-4-dodecyloxy-benzophenone
UV II = 2-(2'-hydroxy-3',5'-di-tert.-amyl-phenyl)-benztriazole.

The experiments were carried out as described in Example 1. After an exposure time of 2.2 seconds (3 passes) in the HANOVIA apparatus, the samples were stored for 30 minutes and the pendulum hardness according to DIN 33,157 was then measured.

TABLE 3

| % by weight of light stabiliser | Pendulum hardness according to Konig (seconds) after an exposure time of 2.2 seconds |
|---|---|
| — | 28 |
| 1% LS I | 43 |
| 1% LS IV | 28 |
| 1% LS V | 36 |
| 1% LS VI | 39 |
| 1% LS VII | 41 |
| 1% LS VIII | 38 |
| 1% LS IX | 28 |
| 1% UV I | <10 |
| 1% UV II | <10 |

It can be seen from this that the UV absorbers used for comparison retard polymerisation whilst the piperidine derivatives according to the invention in some cases even accelerate curing.

What is claimed is:

1. A photocurable composition consisting essentially of (a) one or more ethylenically unsaturated, photocurable compounds, (b) at least one photo-initiator of the formula I

in which Ar is phenyl and R is methyl or ethyl, and (c) at least one light stabiliser from the category of the polyalkylpiperidine derivatives.

2. A composition according to claim 1, consisting essentially of (a) one or more photopolymerisable compounds from the group comprising the acrylic and methacrylic acid derivatives, (b) a photo-initiator of the formula I, in which Ar is phenyl and R is methyl or ethyl, and (c) a light stabiliser from the category of the polyalkylpiperidines.

3. A composition according to claim 2, in which the light stabiliser (c) is an acrylic or methacrylic acid derivative of a polyalkylpiperidine.

4. A composition according to claim 1, consisting essentially of (a) a polyurethane acrylate or a mixture thereof with other acrylic or methacrylic acid derivatives, (b) a photo-initiator of the formula I in which Ar is phenyl and R is methyl or ethyl, and (c) a light stabiliser from the category of the polyalkylpiperidines.

5. A composition according to claim 4, in which the light stabiliser (c) is an acrylic or methacrylic acid derivative of a polyalkylpiperidine.

6. A composition according to claim 1, which contains 0.1 to 10% by weight of component (b).

7. A composition according to claim 1, which contains 0.02 to 5% by weight, of component (c).

8. A composition according to claim 7 which contains 0.5 to 2% by weight of component (c).

* * * * *